(12) United States Patent
Yang et al.

(10) Patent No.: US 8,575,692 B2
(45) Date of Patent: Nov. 5, 2013

(54) NEAR ZERO CHANNEL LENGTH FIELD DRIFT LDMOS

(75) Inventors: Hongning Yang, Chandler, AZ (US); Xin Lin, Phoenix, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 282 days.

(21) Appl. No.: 13/025,350

(22) Filed: Feb. 11, 2011

(65) Prior Publication Data
US 2012/0205738 A1    Aug. 16, 2012

(51) Int. Cl.
*H01L 29/78* (2006.01)

(52) U.S. Cl.
USPC .................................. 257/335; 257/E29.256

(58) Field of Classification Search
None
See application file for complete search history.

(56) References Cited

U.S. PATENT DOCUMENTS

| | | | | |
|---|---|---|---|---|
| 7,608,513 B2 * | 10/2009 | Yang et al. | ..................... | 438/286 |
| 7,776,700 B2 | 8/2010 | Yang et al. | | |
| 8,119,507 B2 * | 2/2012 | You | ............................... | 438/527 |

* cited by examiner

*Primary Examiner* — Wensing Kuo
(74) *Attorney, Agent, or Firm* — Ingrassia Fisher & Lorenz, P.C.

(57) ABSTRACT

Adverse tradeoff between BVDSS and Rdson in LDMOS devices employing a drift space (52, 152) adjacent the drain (56, 156), is avoided by providing a lightly doped region (511, 1511) of a first conductivity type (CT) separating the first CT drift space (52, 152) from an opposite CT WELL region (53, 153) in which the first CT source (57, 157) is located, and a further region (60, 160) of the opposite CT (e.g., formed by an angled implant) extending through part of the WELL region (53, 153) under an edge (591, 1591) of the gate (59, 159) located near a boundary (531, 1531) of the WELL region (53, 153) into the lightly doped region (511, 1511), and a shallow still further region (66, 166) of the first CT Ohmically coupled to the source (57, 157) and ending near the gate edge (591, 159) whereby the effective channel length (61, 161) in the further region (60, 160) is reduced to near zero. Substantial improvement in BVDSS and/or Rdson can be obtained without degrading the other or significant adverse affect on other device properties.

19 Claims, 9 Drawing Sheets

NEAR ZERO CHANNEL LENGTH FIELD DRIFT LDMOS

FIELD OF THE INVENTION

The present invention generally relates to semiconductor devices and circuits and methods for fabricating semiconductor devices and circuits, and more particularly relates to laterally diffused metal-oxide-semiconductor (LDMOS) devices and methods therefore, and circuits employing such devices.

BACKGROUND OF THE INVENTION

Processing technologies and device structures for forming integrated circuits (ICs) are often implemented using a plurality of interconnected field effect transistors (FETs), also called metal-oxide-semiconductor (MOS) field effect transistors (MOSFETs), or simply MOS transistors or devices. A well known subset of MOS transistors is referred to as laterally-diffused metal-oxide-semiconductor (LDMOS) transistors or devices. Although the abbreviation "MOS" and the term "MOS device" literally refer to a device having a metal gate electrode and an oxide gate insulator, that term will be used throughout to refer to any semiconductor device that includes a conductive gate (whether metal or not) that is positioned over a gate insulator (whether oxide or other dielectric) which, in turn, is positioned over a semiconductor substrate. Accordingly, the term metal-oxide-semiconductor and the abbreviations "MOS" and "LDMOS" are used herein even though such devices may not employ just metals or oxides but conductive materials other than metals, and insulating materials other than oxides. Accordingly, as used herein, the terms MOS and LDMOS are intended to include such variations. Non-limiting examples of conductive materials suitable for use in MOS and LDMOS devices are metals, metal alloys, semi-metals, metal-semiconductor alloys or compounds, doped semiconductors, and combinations thereof. Non-limiting examples of insulating materials suitable for use in MOS and LDMOS devices are oxides, nitrides, oxy-nitrides mixtures, organic insulating materials and other dielectrics.

A typical MOS transistor includes a gate "control" electrode and spaced-apart source and drain electrodes between which a current can flow. A voltage applied to the gate controls the flow of current through a conductive channel region induced in the underlying semiconductor between the source and drain. In an LDMOS device, a drift space is provided between the channel region and the drain. In some cases a shallow trench isolation (STI) region or field oxide (e.g. made from an insulator such as an oxide or other dielectric material) is provided in the drift space between the channel region and the drain, in which case the channel current passes underneath the STI region. This type of LDMOS is called "field LDMOS".

BRIEF DESCRIPTION OF THE DRAWINGS

The present invention will hereinafter be described in conjunction with the following drawing figures, wherein like numerals denote like or analogous elements, and wherein.

DETAILED DESCRIPTION OF THE INVENTION

Figure 1A:
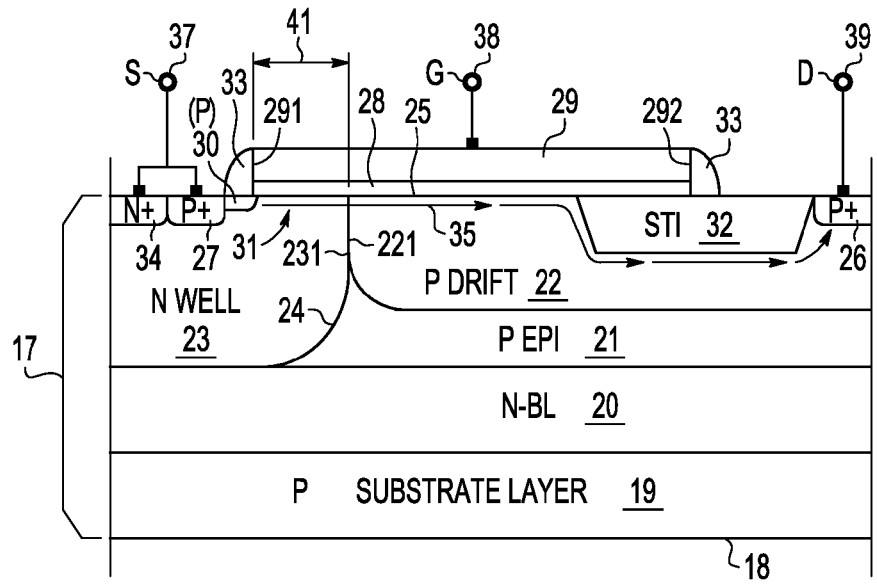
FIGS. 1A and 1B show simplified schematic cross-sectional views through P-channel and N-channel field LDMOS devices, respectively, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and its abbreviation "SC" are intended to include any semiconductor whether single crystal, poly-crystalline, amorphous and combinations thereof, and to include type IV semiconductors, non-type IV semiconductors, compound semiconductors as well as organic and inorganic semiconductors. Further, the terms "substrate", "substrate layer", "semiconductor body", "SC body", "SC substrate" and the like are intended to include single crystal structures, polycrystalline structures, amorphous structures, thin film structures, layered structures as for example and not intended to be limiting, semiconductor-on-insulator (SOI) structures, and combinations thereof. The terms "transistor" and "device" are used interchangeably herein.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N-type or P-type, but this is merely for convenience of description and not intended to be limiting, and such identification may be replaced by the more general description of being of a "first conductivity type" or of a "second, opposite conductivity type" where the first type may be either N-type or P-type and the second type is then either P-type or N-type. Some embodiments of the invention are illustrated herein for P-channel LDMOS devices or transistors, but this is merely for convenience of description and not intended to be limiting. Persons of skill in the art will understand that N-channel LDMOS devices and other types of devices may be provided by appropriate substitution of semiconductor regions of opposite conductivity type.

FIG. 1A is a simplified schematic cross-sectional view through P-channel field LDMOS device 16 according to the prior art. Device 16 is formed in semiconductor body 17 having lower surface 18 and upper surface 25. Semiconductor body 17 comprises P type substrate layer 19, N-type buried layer (BL) 20, and overlying P type EPI region 21 in which have been formed P type drift space 22 and N-type WELL region 23 having PN junction 24 there between extending to surface 25. PN junction 24 occurs at the juncture of rightward boundary 231 of N-type WELL region 23 and leftward boundary 221 of P-type drift space 22 and with part of EPI region 21. WELL region 23 also extends to BL 20 and forms an Ohmic contact therewith. P+ Drain 26 is formed in drift space 22 and P+ source 27 is formed in WELL region 23. Dielectric 28 (e.g., silicon oxide) is formed on semiconductor surface 25. Gate 29 is provided on dielectric 28 extending laterally to the right approximately from source 27, overlapping drift space 22 and shallow trench isolation (STI) region 32. Dielectric side-wall spacers 33 cover lateral edges 291, 292 of gate 29. P-type diffused region 30 may also be provided extending from P+ source 27 under lateral edge 291 of gate 29 to insure that a high resistance does not exist between source 27 and channel region 31 in N-type WELL region 23. STI region 32 extends into drift region 22 from surface 25, partially under gate 29 and extends laterally approximately to drain 26. N+ contact 34 is generally included in device 16 to provide Ohmic contact to N-type WELL region 23. Terminals or electrodes 37, 38, 39 may be conveniently provided to source 27 (and N-WELL region 23), gate 29 and drain 26, respectively. When gate terminal 38 and gate 29 of field LDMOS device 16 are appropriately biased, current 35 flows from source terminal 37 and P+ source 27 via P-type channel region 31 of length 41 in N-type WELL region 23, through P-type drift space 22, beneath STI region 32, and ultimately to P+ drain 26 and drain terminal 39.

Figure 1B:
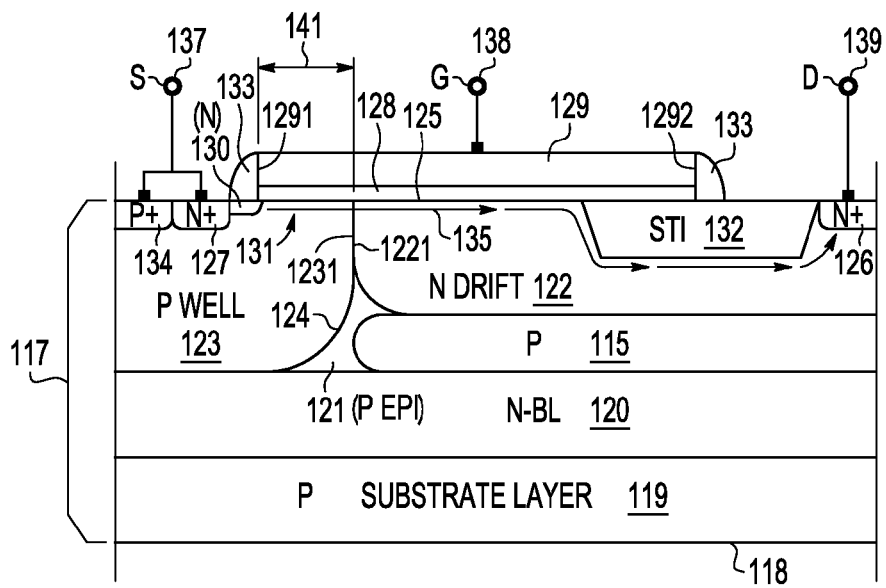

FIG. 1B is a simplified schematic cross-sectional view through N-channel field LDMOS device 116 according to the prior art. Device 116 is formed in semiconductor body 117 having lower surface 118 and upper surface 125. While an N-channel device equivalent to device 16 of FIG. 1A may be formed merely by interchanging N and P doping in device 16 of FIG. 1A, another approach is to utilize an available N-type buried layer (BL) and P-type EPI layer without adding new layers, such as a P-type BL and an N-type EPI layer. Accordingly, N-channel device 116 illustrates a configuration where an N-type BL is employed. Semiconductor body 117 comprises P type substrate layer 119, N-type buried layer (BL) 120 and P type EPI region 121. In P-type EPI region 121 are formed P-type region 115, N-type drift space 122 and P-type WELL region 123. P-type WELL region 123 has PN junction 124 with N-type drift space 122. Junction 124 extends to surface 125. PN junction 124 occurs at the juncture of rightward boundary 1231 of P-type WELL region 123 and leftward boundary 1221 of N-type drift space 122. WELL region 123 also extends to BL 120. N+ Drain 126 is formed in drift space 122 and N+ source 127 is formed in WELL region 123. Dielectric 128 (e.g., silicon oxide) is formed on semiconductor surface 125. Gate 129 is provided on dielectric 128 extending laterally to the right approximately from source 127, overlapping drift space 122 and shallow trench isolation (STI) region 132. Dielectric side-wall spacers 133 cover lateral edges 1291, 1292 of gate 129. N-type diffused region 130 may also be provided extending from N+ source 127 under lateral edge 1291 of gate 129 to insure that a high resistance does not exist between source 127 and channel region 131 in N-type WELL region 123. STI region 132 extends into drift region 122 from surface 125, partially under gate 129 and extends laterally approximately to drain 126. P+ contact 134 is generally included in device 116 to provide Ohmic contact to P-type WELL region 123. Terminals or electrodes 137, 138, 139 may be conveniently provided to source 127 (and P-WELL region 123), gate 129 and drain 126, respectively. When gate terminal 138 and gate 129 of field LDMOS device 116 are appropriately biased, current 135 flows from source terminal 137 and N+ source 127 via N-type channel region 131 of length 141 in P-type WELL region 123, through N-type drift space 122, beneath STI region 132, and ultimately to N+ drain 126 and drain terminal 139.

Figure 2A:
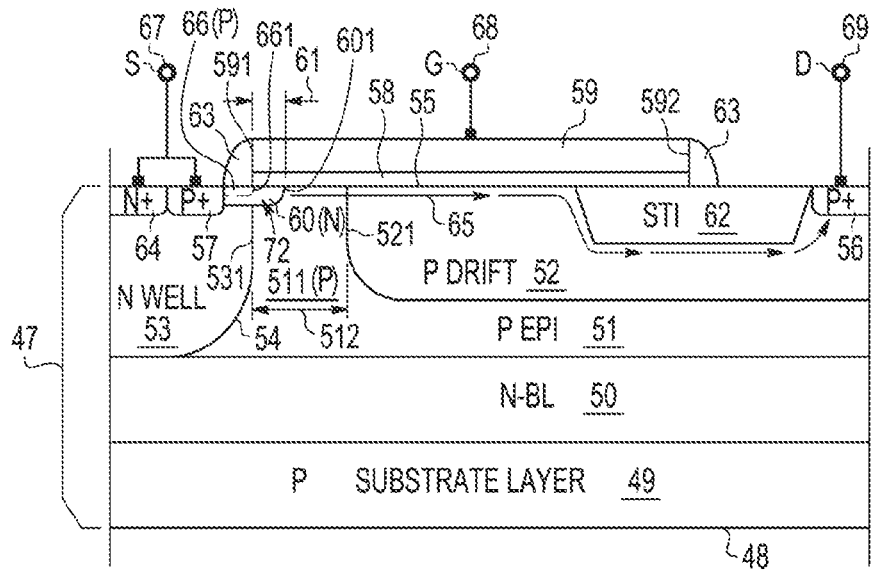
FIGS. 2A and 2B show simplified cross-sectional views of improved P-channel and N-channel field LDMOS devices, respectively, according to embodiments of the invention.

The breakdown voltage (BVDSS) and the source-drain ON-resistance (Rdson) are two critically important properties of LDMOS devices. BVDSS determines the achievable output voltage rating for the device and Rdson determines the device area required to handle a given amount of current, e.g., the current or power rating of the device. In devices such as prior art device 16 of FIG. 1, there is a trade-off between BVDSS and Rdson. For example, designing a device to achieve higher BVDSS (and therefore higher operating voltage) is at the cost of increased Rdson (and thus lower current rating per unit area). Similarly, designing a device to reduce Rdson (and thus increase the current rating per unit area) leads to lower values of BVDSS (and thus lower operating voltage). To reduce Rdson while maintaining the BVDSS means that the device area must be increased, which increases the device cost since, in general, the manufacturing cost of semiconductor devices increases with increasing device area. Accordingly, a need continues to exist for improved LDMOS devices and methods for manufacturing the same, in which Rdson can be decreased without adverse effect on BVDSS, or BVDSS increased without adverse effect on Rdson, or either or both optimized without increasing the device area and thereby adversely affecting the device cost FIG. 2A is a simplified schematic cross-sectional view through P-channel field LDMOS device 46 according to an embodiment of the invention. Device 46 is formed in semiconductor body 47 having lower surface 48 and upper surface 55. Semiconductor body 47 comprises P type substrate layer 49, N-type buried layer (BL) 50, and overlying P type (e.g., EPI) semiconductor region 51 in which have been formed P type drift space 52 having leftward boundary or edge 521, and N-type WELL region 53 having rightward boundary or edge 531. Rightward boundary or edge 531 of WELL region 53 forms PN junction 54 extending to surface 55, with portion 511 of P-type (e.g., EPI) region 51. In a preferred embodiment, N-type WELL region 53 extends to underlying N-type BL 50, making Ohmic contact thereto. P+ drain 56 is formed in drift space 52 and P+ source 57 is formed in N-type WELL region 53. Dielectric 58 (e.g. silicon oxide) is formed on semiconductor surface 55. Gate 59 is provided on dielectric 58 extending laterally (e.g., to the right in FIG. 2A) from near source 57 over portion 511 of EPI region 51, over drift space 52 and preferably but not essentially also partly over shallow trench isolation (STI) region 62. Gate 59 has leftward lateral edge 591 aligned substantially with rightward edge 531 of N-type WELL region 53 and rightward edge 592 located preferably but not essentially above STI region 62. Dielectric side-wall spacers 63 cover lateral edges 591, 592 of gate 59. N-type doped region 60 is provided extending laterally rightward about from P+ source 57 under leftward edge 591 of gate 59 approximately for distance 61 into P-type portion 511 of P-type region 51 to rightward edge 601 of region 60 beyond rightward boundary or edge 531 of N-type WELL region 53. Somewhat more highly doped shallow P-type region 66 is provided in region 60 extending laterally from P+ source 57 and with rightward edge 661 about underlying leftward gate edge 591. More accurately, distance (e.g., channel length) 61 is the lateral separation between rightward edge 661 of doped region 66 and rightward edge 601 of doped region 60. (Further details concerning doped regions 60, 66 and their relation ship to gate edge 591 are provided in connection with FIGS. 4-13.) STI region 62 extends into drift region 52 from surface 55, preferably but not essentially partially under gate 59 and extends laterally approximately to drain 56. N+ contact 64 is desirably included in device 46 to provide Ohmic contact to WELL region 53. Terminals or electrodes 67, 68, 69 may be conveniently provided to source 57 (and optionally to WELL region 53 and BL 50 via contact 64), gate 59 and drain 56, respectively. When LDMOS device 46 is appropriately biased, current 65 flows from source terminal 67 and source 57 via P-type doped region 66 and field induced P-type channel 72 of length 61 in N-type doped region 60 extending from WELL region 53 into P-type portion 511 of P-type EPI layer 51 proximate N-type WELL region 53. Current 65 then flows through the remainder of P-type portion 511 lying between N-type WELL region 53 and P-type drift space 52, then into and through P-type drift space 52, beneath STI region 62, and ultimately to P+ drain 56 and drain terminal 69. Shallow P-type doped region 66 extending from source 57 laterally approximately to gate edge 591 provides low resistance coupling between P+ source 57 and field induced P-type channel 72 of length 61 in N-type region 60. Field induced P-type channel 72 extends for distance 61 from rightward end 661 of P-type region 66 through N-type region 60 to rightward end 601 thereof in contact with relatively lightly doped P-type portion 511 of P-type (e.g., EPI) region 51.

Comparing prior art device 16 of FIG. 1A and device 46 of FIG. A2, it will be noted that WELL region 23 and drift space 22 of prior art device 16 of FIG. 1A abut at PN junction 24 there between, whereas WELL region 53 and drift space 52 of improved device 46 of FIG. 2A do not abut but are laterally separated by more lightly doped portion 511 of width 512 of P-type (e.g., EPI) region 51. It should also be noted that, unlike prior art device 16 of FIG. 1A, in device 46 of FIG. 2A, source-drain current 65 passing from P+ source 57 to P+ drain 56, goes through very short field induced P-type channel region 72 of length 61 between rightward end 661 of P-type region 66 and rightward end 601 of N-type doped region 60 extending into P-type portion 511. Because channel length 61 of device 46 can be made much shorter than channel length 41 of prior art device 16, device 46 illustrated in FIG. 2A is referred to as a "near zero channel length LDMOS" device. This feature in combination with relatively lightly doped P-type portion 511 at the terminus of channel 72 through N-type region 60 provides improved Rdson without adverse impact on BVDSS and vice versa.

Figure 2B:
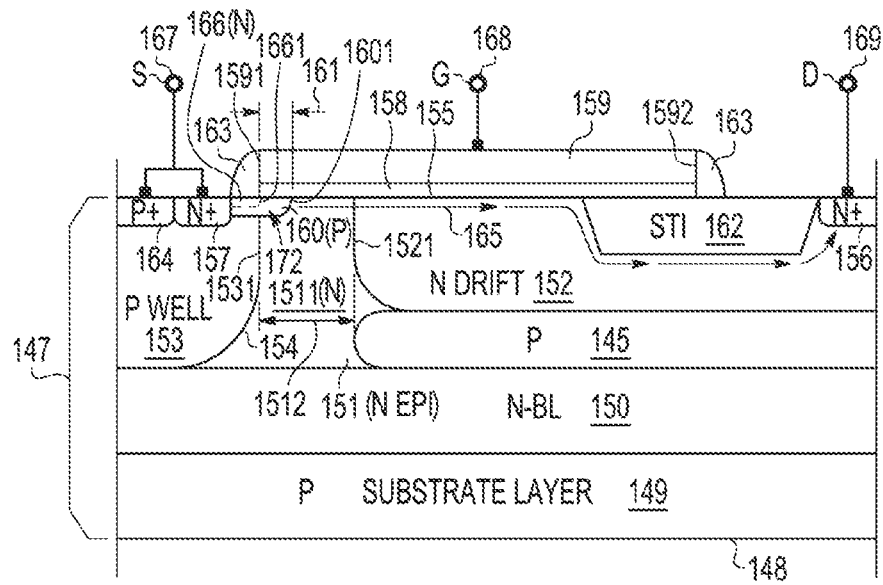
Figure 3:
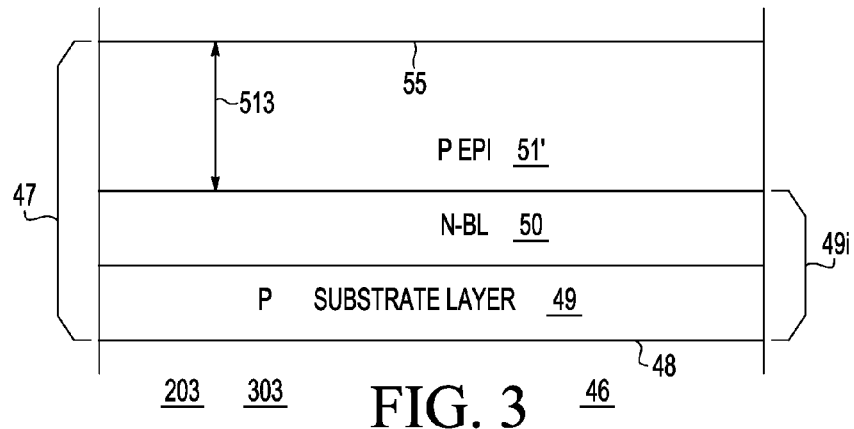
FIGS. 3-13 show simplified cross-sectional views of the P-channel field LDMOS device of FIG. 2A during various stages of manufacture according to further embodiments of the invention.

FIG. 2B is a simplified schematic cross-sectional view through N-channel field LDMOS device 146 according to another embodiment of the invention. Device 146 is formed in semiconductor body 147 having lower surface 148 and upper surface 155. While an N-channel device equivalent to device 46 of FIG. 2A may be formed merely by interchanging N and P doping in device 46 of FIG. 2A, in order to continue to use an N-type buried layer (BL) different foundation layers are utilized. Accordingly, N-channel device 146 illustrates a configuration where an N-type BL is employed. Semiconductor body 147 comprises P-type substrate layer 149, N-type buried layer (BL) 150, and overlying N type (e.g., EPI) semiconductor region 151. P-type substrate layer 149 may be omitted in other embodiments. In N-type region 151 are formed P-type region 145, N-type drift space 152 and P-type WELL region 153. P-type WELL region 153 has PN junction 154 with N-type portion 1511 of N-type region 151. Junction 154 extends to surface 155. Rightward boundary or edge 1531 of WELL region 153 forms PN junction 154 extending to surface 155 with portion or part 1511 of N-type (e.g., EPI) region 151. In a preferred embodiment, P-type WELL region 153 may extend to underlying N-type BL 150. When desired, electrical contact may be made to BL 150 from front surface 155 by providing a further N-WELL (not shown) extending from surface 155 to BL 150, or from lower surface 148 by locally or generally omitting P-type substrate layer 149 (or converting it to N-type) and using a back-side contact on surface 148. Either arrangement is useful. N+ drain 156 is formed in drift space 152 and N+ source 157 is formed in P-type WELL region 153. Dielectric 158 (e.g. silicon oxide) is formed on semiconductor surface 155. Gate 159 is provided on dielectric 158 extending laterally (e.g., to the right in FIG. 2B) from near source 157 over portion 1511 of (e.g., EPI) region 151, over drift space 152 and preferably but not essentially also partly over shallow trench isolation (STI) region 162.ABbreviation. Gate 159 has leftward lateral edge 1591 aligned substantially with rightward edge 1531 of P-type WELL region 153 and rightward edge 1592 preferably but not essentially located above STI region 162. Dielectric side-wall spacers 163 cover lateral edges 1591, 1592 of gate 159. P-type doped region 160 is provided extending laterally rightward about from N+ source 157 under leftward edge 1591 of gate 159 approximately for distance (e.g., channel length) 161 into N-type portion 1511 of N-type region 151 to rightward edge 1601 of region 160 beyond rightward boundary or edge 1531 of P-type WELL region 153. Somewhat more highly doped shallow N-type region 166 is provided in region 160 extending rightward laterally from N+ source 157 and having rightward edge 1661 about underlying leftward gate edge 1591. More accurately, distance (e.g., channel length) 161 is the lateral separation between rightward edge 1661 of doped region 166 and rightward edge 1601 of doped region 160. STI region 162 extends into drift region 152 from surface 155, preferably but not essentially partially under gate 159 and extends laterally approximately to drain 156. P+ contact 164 is desirably included in device 146 to provide Ohmic contact to WELL region 153. Terminals or electrodes 167, 168, 169 may be conveniently provided to source 157 (and optionally to WELL region 153 via contact 164), gate 159 and drain 156, respectively. When LDMOS device 146 is appropriately biased, current 165 flows from source terminal 167 and source 157 via N-type doped region 166 and field induced N-type channel 172 of length 161 in P-type doped region 160 extending from WELL region 153 into N-type portion 1511 of N-type (e.g., EPI) layer 151 proximate P-type WELL region 153. Current 165 then flows through the remainder of N-type portion 1511 lying between P-type WELL region 153 and N-type drift space 152, then into and through N-type drift space 152, beneath STI region 162, and ultimately to N+ drain 156 and drain terminal 169. Shallow N-type doped region 166 extending from source 157 laterally approximately to gate edge 1591 provides low resistance coupling between N+ source 157 and field induced N-type channel 172 of length 161 in P-type region 160. Field induced N-type channel 172 extends for (e.g., channel length) distance 161 from rightward end 1661 of N-type region 166 through P-type region 160 to rightward end 1601 thereof in contact with relatively lightly doped N-type portion 1511 of N-type (e.g., EPI) region 151.

Comparing prior art device 116 of FIG. 1B and device 146 of FIG. 2B, it will be noted that WELL region 123 and drift space 122 of prior art device 116 of FIG. 1B abut at PN junction 124 there between, whereas WELL region 153 and drift space 152 of improved device 146 of FIG. 2B do not abut but are laterally separated by more lightly doped portion 1511 of width 1512 of N-type (e.g., EPI) region 151 It should also be noted that, unlike prior art device 116 of FIG. 1B, in device 146 of FIG. 2B, source-drain current 165 passing from N+ source 157 to N+ drain 156, goes through very short field induced N-type channel region 172 of length 161 between rightward end 1661 of N-type region 166 and rightward end 1601 of P-type region 160 extending into N-type portion 1511. Because channel length 161 of device 146 can be made much shorter than channel length 141 of prior art device 116, device 146 illustrated in FIG. 2B is referred to as a "near zero channel length LDMOS" device. An important difference between prior art N-type LDMOS device 116 of FIG. 1B and improved N-type LDMOS device 146 of FIG. 2B, is that, (e.g., EPI) layer 151 is N-type in device 146 thereby facilitating the near zero channel length structure. In contrast, in device 116, analogous layer 121 can be either P-type or N-type without affecting inherently greater channel length 141. The near zero channel length feature of device 146 of FIG. 2B in combination with relatively lightly doped N-type portion 1511 at the terminus of channel 172 through P-type region 160 provides improved Rdson without adverse impact on BVDSS and vice versa.

It is found that the above-described structure of devices 46, 146 of FIGS. 2A and 2B provide, among other things, significantly improved BVDSS without adverse effect on Rdson or significant increase in device leakage current. Table I below illustrates the comparative results obtained from prior art devices such as device 16 of FIG. 1A versus improved devices such as device 46 of FIG. 2A, of approximately comparable area. Rdson, source-drain (S-D) leakage current and S-D current rating are normalized to avoid any differences in results that might arise from slight differences in dimensions or area. The normalized parameter "Amps/Micrometer" refers to the measured current in Amps divided by the channel width in Micrometers, where channel width is measured in a direction perpendicular to the plane of FIGS. 1A and 2A.

TABLE I

COMPARISON of CONVENTIONAL and NEAR ZERO CHANNEL LENGTH FIELD DRIFT LDMOS DEVICES

| | BVDSS in volts | Rdson * Area in Milli-Ohms * cm$^2$ | S-D Leakage Current in Amps/Micrometer at V$_{SD}$ = 30 volts | S-D Current Rating in Amps/Micrometer at V$_{SD}$ = 30 volts and Vg = 5 volts |
|---|---|---|---|---|
| PRIOR ART DEVICE 16 | 37 | 0.444 | ~4E−14 | ~2.4E−4 |
| NEAR ZERO-CHANNEL LENGTH | 48 | 0.333 | ~5E−14 | ~3.2E−4 |
| DEVICE 46 CHANGE | ~30% Increase | ~30% Reduction | ~1E−14 Increase | ~33% Increase |

It will be apparent that substantial improvement in BVDSS, Rdson, and Current Rating is provided, for example, by LDMOS device 46 of FIG. 2A compared to prior art device 16 of FIG. 1A. The leakage current is comparable between devices 16 and 46 within the measurement uncertainty of ~1E14, indicating that the leakage current is not a significant issue for the very short channel length in the near zero channel length LDMOS devices illustrated herein. Additionally, it is observed that the current gain of the improved LDMOS device is equal or greater than the gain of an otherwise comparable prior art device under similar bias conditions. Thus, the improvements in BVDSS and Rdson are obtained without significant adverse impact on each other or on other important device properties. Unlike prior art devices, BVDSS and/or Rdson may be optimized without significant adverse impact on the other. This is a very desirable improvement in the art.

FIGS. 3-13 show simplified cross-sectional views, by way of example, of LDMOS device 46 of FIG. 2A during various stages 203-213 of manufacture according to further embodiments of the invention. Persons of skill in the art will understand how devices of the type illustrated in FIG. 2B may be formed in an analogous manner taking into account the differences in doping type in the various regions being formed. Referring now to manufacturing stage 203 of FIG. 3, there is provided semiconductor body 47 comprising (e.g. P-type) substrate layer 49 with overlying (e.g., N-type) buried layer (BL) 50 on which, in a preferred embodiment, has been formed lightly doped (e.g., P-type) region 51' of thickness 513 extending to surface 55. Region 51' is identified with a prime (') in FIGS. 3-5 to indicate that it is a precursor to region 51 (including portion 511) illustrated in FIGS. 2A and 6-13. In a preferred embodiment, initial substrate 49$i$ is provided, (e.g., N type) BL 50 formed therein, for example by implant doping or other means leaving (e.g., P type) substrate layer 49 as shown, and then (e.g., P-type) EPI layer 51' is grown thereon, but other means and methods for forming SC body 47 may also be used. BL region 50 usefully has doping in the range of about 1E17 to 1E20 cm$^{-3}$, conveniently in the range of about 1E18 to 5E19 cm$^{-3}$, and preferably in the range of about 5E18 to 2E19 cm$^{-3}$, but higher or lower doping may be used in other embodiments. In other embodiments, substrate body 47 may be formed by other means well known in the art and such variations are intended to be included in the present invention. Accordingly, the designation "EPI" with respect to regions 51' and 51 is intended to include such variations, whether formed by epitaxial growth or not. EPI region 51' usefully has doping in the range of about 1E13 to 1E16 cm$^{-3}$, conveniently in the range of about 1E14 to 5E15 cm$^{-3}$, and preferably in the range of about 1E15 to 3E15 cm$^{-3}$, but higher or lower doping may be used in other embodiments. Thickness 513 is usefully in the range of about 2 to 7 micrometers, conveniently in the range of about 3 to 6 micrometers, and preferably in the range of about 4 to 5 micrometers, but larger or smaller thicknesses may be used in other embodiments. Structure 303 results. As is described later, the doping concentration $C_{PSCR}$ of portion or part 511 (see FIGS. 2A and 3-6) that is subsequently formed from (e.g., EPI) region 51' is substantially determined by the doping of region 51'.

Figure 4:
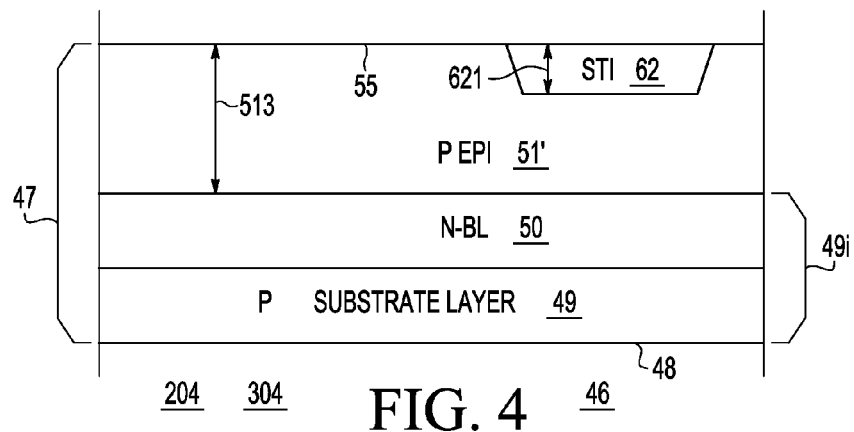

In manufacturing stage 204 of FIG. 4, shallow trench isolation (STI) region 62 is desirably formed extending into region 51' from surface 55 to depth 621. STI region 62 is formed by means well known in the art. Depth 621 of STI region 62 is usefully in the range of about 0.2 to 0.6 micrometers, conveniently in the range of about 0.3 to 0.5 micrometers, and preferably in the range of about 0.35 to 0.4 micrometers, but larger or smaller depths may be used in other embodiments. Structure 304 results.

Figure 5:
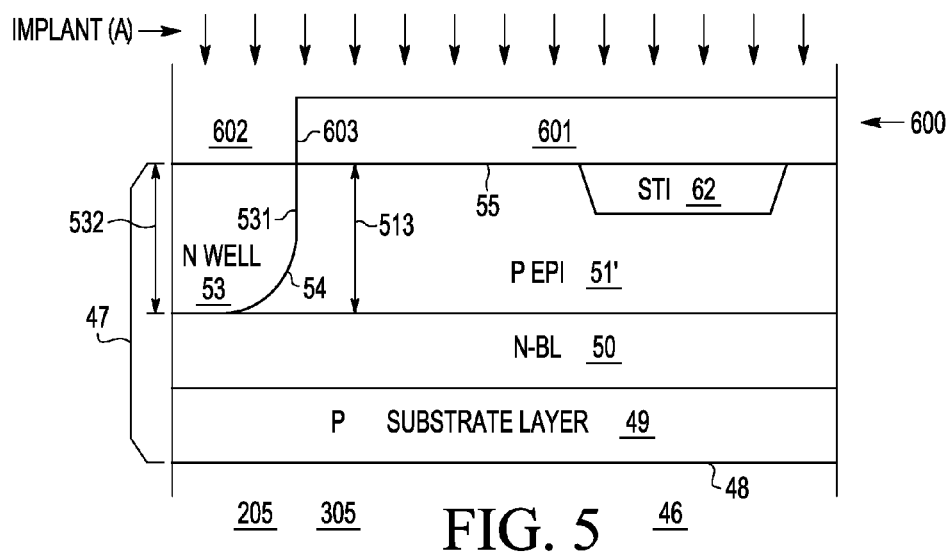

Referring now to manufacturing stage 205 of FIG. 5, mask 600 is desirably provided over surface 55 of SC body 47. In this and subsequent manufacturing stages where ion implantation is used as a preferred doping means, photo-resist is a suitable mask material, but other mask materials well known in the art may also be used in other embodiments. Mask 600 has closed portion 601 and opening 602 located over the intended position of WELL region 53 of FIG. 2. Adjacent opening 602 is leftward mask edge 603. In a preferred embodiment, Implant (A) is provided through opening 602 to form WELL region 53 with rightward boundary 531 of WELL region 53 substantially underlying leftward edge 603 of mask 600, taking into account any lateral spreading of dopant in WELL region 53 during formation and subsequent heat treatments. In a preferred embodiment, WELL region 53 has depth 532 substantially at least equal to thickness 513 of EPI region 51' so that it extends to BL 50 (e.g., as shown in FIG. 2A) to provide Ohmic contact thereto, but this connection may be omitted or provided by other means in further embodiments. Phosphorus, arsenic and antimony are suitable dopants for forming N-type WELL region 53. WELL region 53 usefully has doping in the range of about 1E16 to 1E19 $cm^{-3}$, conveniently in the range of about 5E16 to 5E18 $cm^{-3}$, and preferably in the range of about 5E16 to 1E18 $cm^{-3}$, but other dopants and higher or lower dopant concentrations may be used in other embodiments. Structure 305 results. While mask 600 is conveniently used for forming WELL region 53, other masks (e.g., mask 611 of FIG. 9) having an opening exposing a substantially similar portion of SC body 47 may also be used and WELL region 53 formed at other stages of the overall manufacturing process. Further, while WELL region 53 is desirably formed in manufacturing stage 205 prior to forming the gate in manufacturing stage 207 (e.g., see FIG. 7) so that their respective edges 531, 591 are in reasonable lateral proximity, such order of formation is not essential and persons of skill in the art will understand that placing edges 531 and 591 in reasonable lateral proximity may be accomplished using other sequences and/or alignment means.

Figure 6:
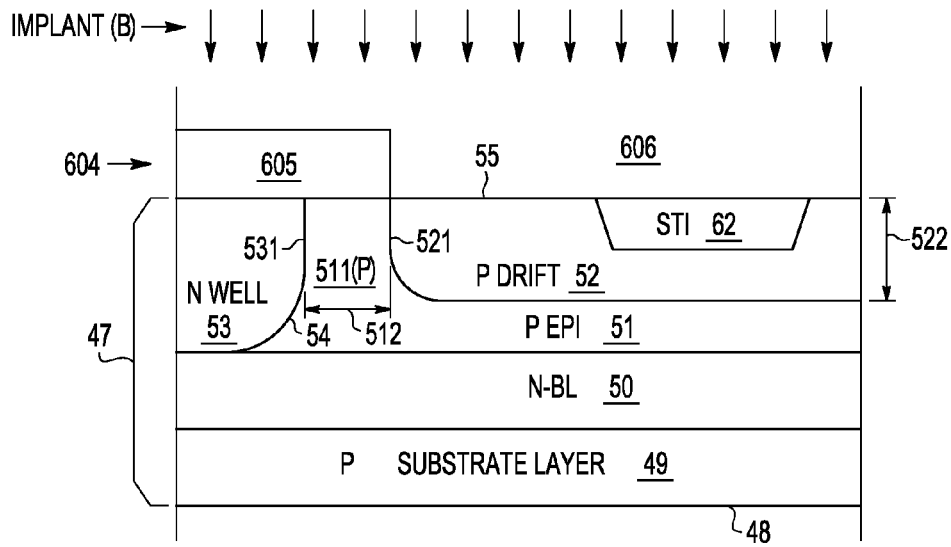

Referring now to manufacturing stage 206 of FIG. 6, mask 600 is removed and replaced with mask 604 having closed portion 605 and opening 606 located over the intended position of drift space 52 of FIG. 2. In a preferred embodiment, Implant (B) is provided through opening 606 to form drift space 52 having leftward boundary 521 spaced substantially at lateral distance 512 from rightward boundary 531 of WELL region 53, taking into account any lateral spreading of dopant in WELL region 53 and drift space 52 during formation or subsequent heat treatments. Drift space 52 has depth 522 usefully in the range of about 0.5 to 3 micrometers, conveniently in the range of about 1.5 to 2.7 micrometers, and preferably in the range of about 2 to 2.5 micrometers, but larger or smaller depths may be used in other embodiments. Boron is an example of a suitable dopant for forming drift space 52. Drift space 52 has doping at least greater than the doping of (e.g., EPI) region 51, and usefully in the range of about 5E15 to 5E17 $cm^{-3}$, conveniently in the range of about 1E16 to 1E17 $cm^{-3}$, and preferably in the range of about 3E16 to 5E16 $cm^{-3}$, but other dopants and higher or lower dopant concentrations may be used in other embodiments. Stated another way, the doping of drift space 52 is desirably of the same conductivity type and 10 to 100 times greater than the doping of region 51. Structure 306 results. Manufacturing stages 205 and 206 may be performed in either order.

Figure 7:
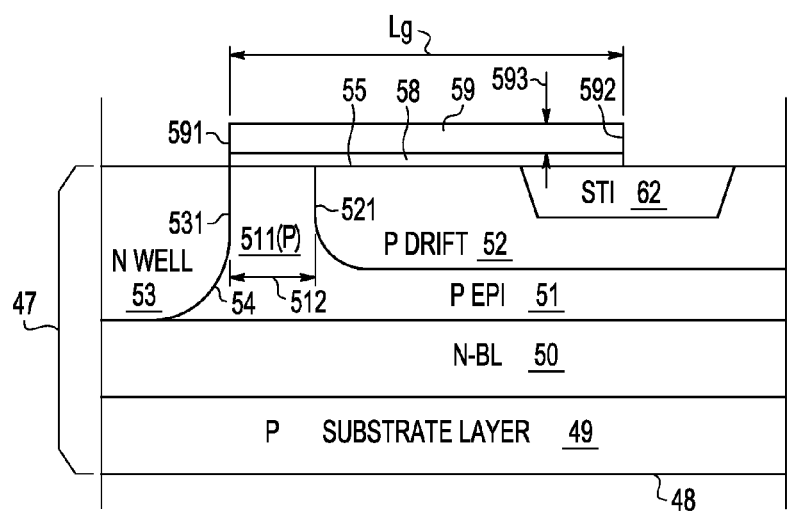

Referring now to manufacturing stage 207 of FIG. 7, mask 604 is removed. Gate insulator 58 (e.g., silicon oxide) is provided on SC surface 55 to a thickness depending upon the desired input voltage rating and gain using means well known in the art, but other dielectric materials and other thicknesses may be used for gate insulator 58 in other embodiments. Gate insulator 58 may be formed any time prior to formation of conductive gate 59 in manufacturing stage 207. Electrically conductive gate 59 is formed over gate insulator 58, for example and not intended to be limiting, preferably of metal or semi-metals or doped semiconductor or combinations thereof, for example, by vacuum deposition or sputtering, but other materials and deposition or formation techniques may also be used in other embodiments. Doped polysilicon is a non-limiting example of a suitable material for gate 59, but other electrically conductive materials in homogeneous or layered configurations may be used for gate 59 in still other embodiments. Conventional masking and etching steps (not shown) are conveniently used to define the lateral extent and location of gate 59. Gate 59 has leftward edge 591 substantially aligned with rightward boundary or edge 661 of doped region 66, which in a preferred embodiment, is formed using edge 591 of gate 59 as a masking edge. Gate 59 has gate length Lg parallel to the plane of FIGS. 2 and 7, and rightward edge 592 desirably but not essentially located over STI region 62. Structure 307 results.

Figure 8:
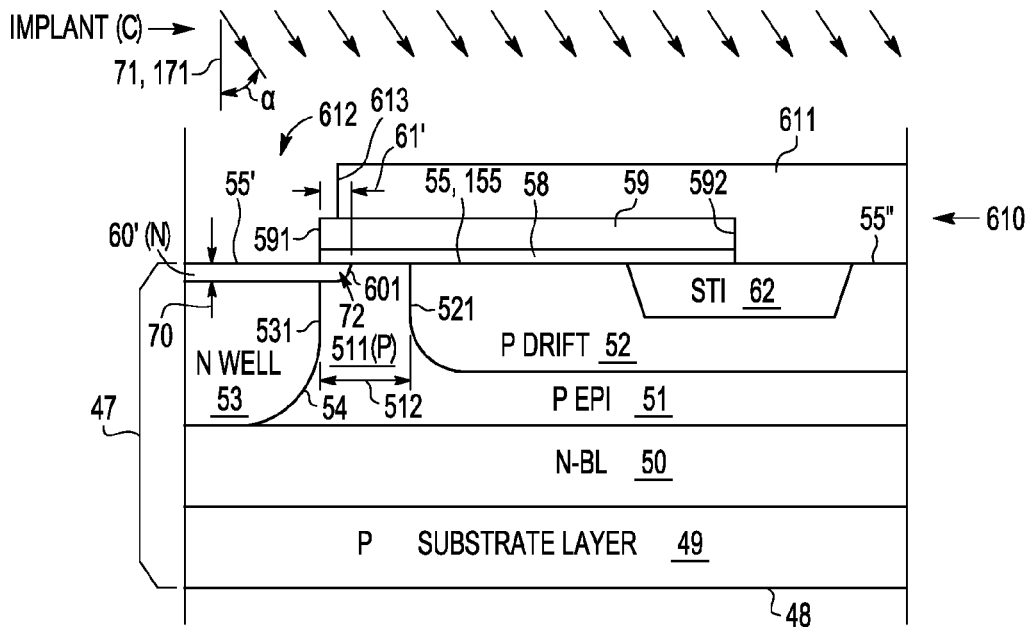
Figure 9:
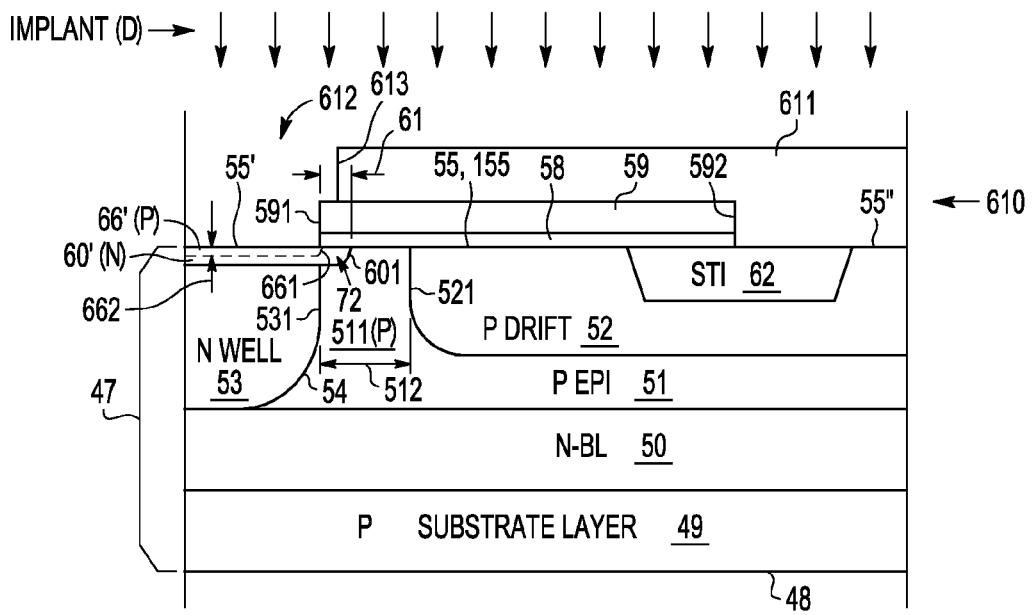

Referring now to manufacturing stage 208 of FIG. 8, in a preferred embodiment, mask 610 is provided over surface 55 having closed portion 611 and opening 612. In the embodiments of FIGS. 8-9, closed portion 611 of mask 610 extends over gate 59, the exposed portion of STI region 62 and the intended location of drain 56 of FIG. 2 to the right of STI region 62 in SC surface portion 55", but in other embodiments, closed portion 611 need not extend there over. Opening 612 is located substantially over portion 55' of surface 55 to the left of gate edge 591. Leftward edge 613 of mask 610 is conveniently located anywhere between leftward edge 591 and rightward edge 592 of gate 59. Implant (C) (e.g., N type) is provided through opening 612 to form (e.g., N-type) further region 60', where a prime (') is used here to indicate that further region 60' is a precursor to (e.g., N type) further region 60 illustrated in FIGS. 2A and 12-13. The energy of Implant (C) is desirably selected so that gate 59 substantially blocks Implant (C), thereby enabling gate 59 itself and especially leftward edge 591 of gate 59 to act as a laterally defining (e.g., "masking") edge for Implant (C). However, lateral edge 613 of, for example, mask 610 or other masks, when in an appropriate location can also serve as the masking edge. Either arrangement is useful. Implant (C) is desirably an implant performed at angle α with respect to normal 71 to surface 55'. Arsenic is a non-limiting example of a suitable dopant material for Implant (C), but other dopants may also be used in other embodiments. Angle α should be greater than zero and is usefully in the range of about 10 to 70 degrees, conveniently in the range of about 20 to 60 degrees and preferably in the range of about 35 to 55 degrees, but other angles may also be used in other embodiments. The use of angled Implant (C) enables (e.g., N type) further region 60' to extend laterally under and to the right of gate edge 591 into the leftward part of portion 511 of EPI region 51 by lateral distance 61' from gate edge 591 and to depth 70 below surface 55'. Doped region 60' has rightward edge 601. It is in the location between edge 661 of subsequently formed doped region 661 (see FIG. 9) roughly proximate the location of gate edge 591, and edge 601 of doped region 60 that field induceable channel region 72 forms (see FIGS. 2A and 9) when device 46 is biased. Further region 60', 60 usefully has doping $C_{FR}$ in the range of about 1E18 to 5E20 cm$^{-3}$, conveniently in the range of about 5E18 to 1E20 cm$^{-3}$, and preferably in the range of about 1E19 to 5E19 cm$^{-3}$, but higher or lower doping may be used in yet other embodiments. Stated another way, the ratio of the dopant concentration $C_{FR}$ in further region 60 to the dopant concentration $C_{PSCR}$ in part 511 of semiconductor region 51, is usefully in the range of about $C_{FR}/C_{PSCR}=10^1$ to $10^8$, more conveniently in the range of about $C_{FR}/C_{PSCR}=10^2$ to $10^7$ and preferably about $C_{FR}/C_{PSCR}=10^3$ to $10^4$. Depth 70 of doped region 60 is usefully in the range of about 0.1 to 0.3 micrometers, conveniently in the range of about 0.08 to 0.20 micrometers, and preferably in the range of about 0.15 micrometers, but larger or smaller depths may be used in other embodiments. Edge 591 of gate 59 need not be precisely aligned with boundary or edge 531 of (e.g., N type) WELL 53, provided that doped region 60', 60 extends past boundary or edge 531 into part 511 of semiconductor (e.g., EPI) region 51. Also, while opening 612 is shown in manufacturing stages 208 and 209 as encompassing the eventual location of (e.g., N+) body contact 64 in FIG. 2, in other embodiments, mask opening 612 may be made narrower or wider. It is desirable that it include the eventual location of source 57 and gate edge 591. Further, since edge 591 of gate 59 can be used for defining the location of doped region 60', 60, mask 610 may be omitted in other embodiments. Structure 308 results.

Referring now to manufacturing stage 209 of FIG. 9, mask 610 is preferably left in place with closed portion 611 and opening 612 as previously described. However, in other embodiments, mask 610 may be removed and replaced with another mask having functionally equivalent open and closed portions, or omitted entirely. Either arrangement is useful. In a preferred embodiment, Implant (D) is provided through opening 612 or equivalent, thereby forming shallow (e.g., P-type) still further region 66' of depth 662 beneath opening 612 and having rightward edge 661 substantially defined in a preferred embodiment, by gate edge 591. As before, a prime (') is added to doped region 66' to indicate that it is the precursor to unprimed doped region 66 illustrated in FIGS. 2A and 12-13. Still further region 66' desirably has doping concentration $C_{SFR}$ greater than doping concentration $C_{FR}$ of further region 60', usefully in the range of about 1E19 to 1E20 cm$^{-3}$, conveniently in the range of about 3E19 to 8E19 cm$^{-3}$, and preferably in the range of about 4E19 to 6E19 cm$^{-3}$, but higher or lower doping may be used in other embodiments. Stated another way, the ratio of the dopant concentration $C_{SFR}$ in still further region 66' to the dopant concentration $C_{FR}$ in further region 60', is usefully in the range of about $C_{SFR}/C_{FR}=2$ to $10^2$, more conveniently in the range of about $C_{SFR}/C_{FR}=4$ to $10^2$ and preferably about $C_{SFR}/C_{FR}=5$ to 10. Depth 662 of doped further region 66' is usefully in the range of about 0.01 to 0.05 micrometers, conveniently in the range of about 0.01 to 0.03 micrometers, and preferably in the range of about 0.01 to 0.02 micrometers, but larger or smaller depths may be used in other embodiments. Doped region 66', 66 is useful for reducing the series resistance between source 57 (see FIG. 2) and channel 72 that forms in doped region 60 when gate 59 is appropriately biased, but may be omitted in other embodiments. Structure 309 results.

Referring again to structure 309 of FIG. 9 and to FIG. 2A, distance 61 between edge 661 of still further region 66 and edge 601 of further region 60 substantially determines length 61 of channel 72. Channel length 61 may be adjusted by: (i) varying angle α, the energy and the dose of Implant C that determines the location of edge 601, and/or (ii) varying an implant angle β, the energy and the dose of Implant D that determines the location of edge 661, where angle β of Implant D is defined in the same manner as angle α of Implant C. (Angle β is not shown in FIG. 9 since it is presumed in this example to be substantially zero.) Channel length 61 is usefully in the range of about 0.005 to 0.20 micrometers, conveniently in the range of about 0.01 to 0.15 micrometers, and preferably in the range of about 0.05 to 0.075 micrometers, but larger or smaller lateral distances may be provided in other embodiments by, for example, adjusting one or both of angles α and/or β. In FIG. 9, Implant D is shown as being substantially perpendicular to surface 55 of SC body 47 (i.e., (β=0), but this is merely intended to illustrate a preferred embodiment and not be limiting. If Implant D is provided at an angle β≠0, then channel length 61 may be adjusted by, among other things, varying the difference α−β between the two angles.

Figure 10:
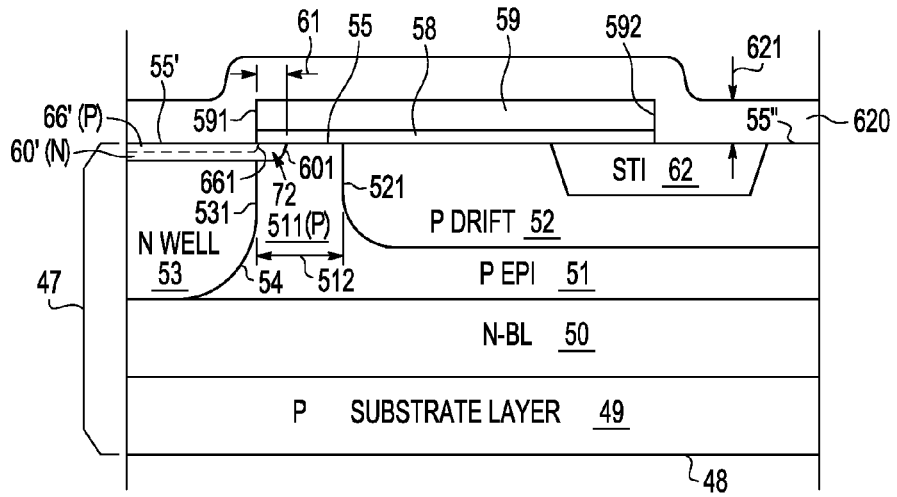
Figure 11:
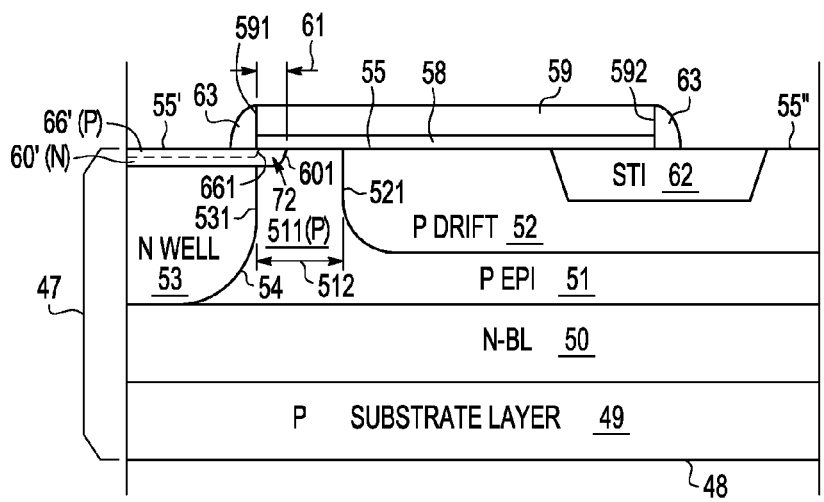

Referring now to manufacturing stage 210 of FIG. 10, mask 610 (if used) is removed and replaced with dielectric layer 620 of thickness 621 extending laterally over surface 55, 55', 55" and gate 59. Layer 620 is used to form dielectric sidewall spacers 63 on gate 59, as illustrated in FIG. 2A. Layer 620 is desirably formed of silicon nitride and of thickness 621 less than or equal to thickness 593 of gate 59 including dielectric 58, but other materials and thicknesses can be used in other embodiments. Thickness 621 is usefully in the range of about 0.02 to 0.9 micrometers, conveniently in the range of about 0.05 to 0.5 micrometers, and preferably in the range of about 0.15 to 0.2 micrometers, but larger or smaller thicknesses may be used in other embodiments. Structure 310 results. Referring now to manufacturing stage 211 of FIG. 11, structure 310 is subjected to a substantially anisotropic (e.g., vertical) etch to re-expose gate 59, surface portion 55', STI region 62 and surface portion 55" of SC body 47, leaving behind dielectric sidewall spacers 63 on lateral edges 591, 592 of gate 59. Structure 311 results.

Figure 12:
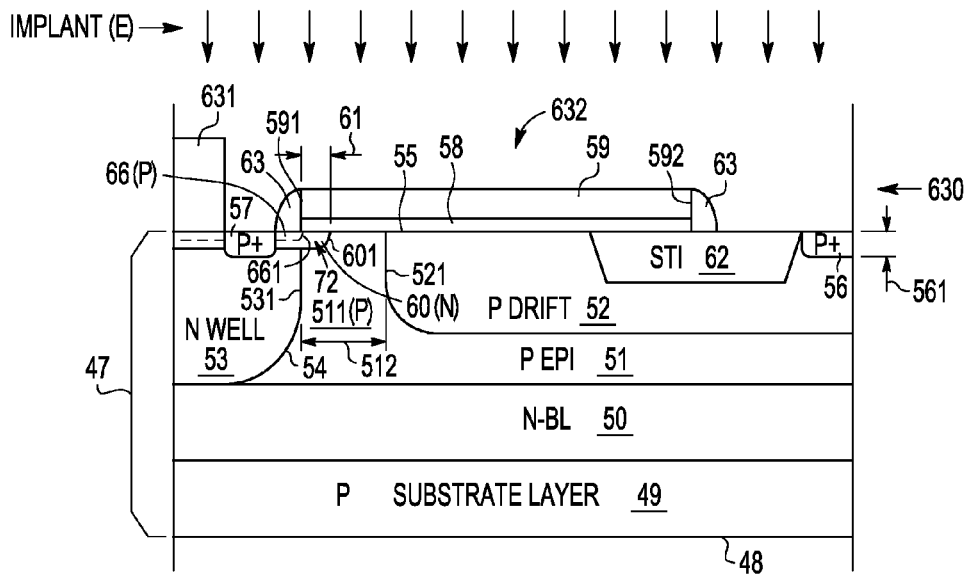
Figure 13:
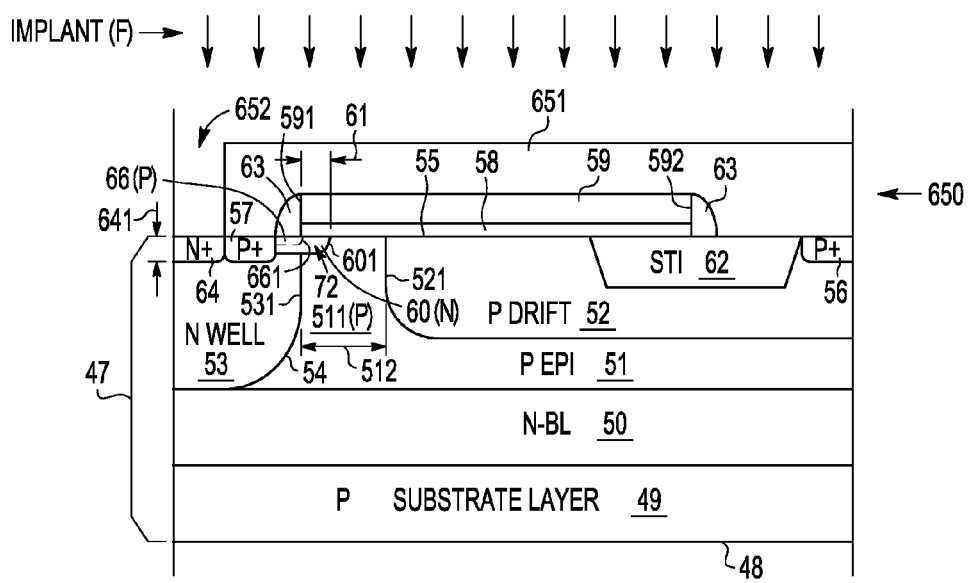

Referring now to manufacturing stage 212 of FIG. 12, mask 630 having closed portion 631 and opening 632 is provided over structure 311. In a preferred embodiment, opening 632 of mask 630 spans the intended location of both drain 56 and source 57 (and may include including gate 59 and sidewall spacers 63) but, preferably not the intended location of (e.g., N+) contact 64 shown in FIG. 2. However, in other embodiments separate openings may be provided for drain 56 and source 57 and the rest of the surface masked. Either arrangement is useful, but for convenience of description and not intended to be limiting, it is assumed that single opening 632 is provided spanning the desired locations of both drain 56 and source 57. Implant (E) (e.g., P+) is provided, and assuming that gate 59 is exposed, using an energy sufficiently low that gate 59 and dielectric side-wall spacers 63 are able to mask those portions of surface 55 and 55' underlying gate 59 and side-wall spacers 63, thereby forming (e.g., P+) drain 56 to the right of STI region 62 and (e.g., P+) source 57 to the left of dielectric sidewall spacer 63 on leftward edge 591 of gate 59, having depth 561 from surface 55. Doped regions 60, 66 derived from doped regions 60', 66' where not over-doped by source 57 are indicated in FIGS. 2A and 12-13. Boron is a suitable dopant for forming drain 56 and source 57, but other dopants may be used in other embodiments. Drain 56 and source 57 usefully have doping in the range of about 1E20 to 1E22 $cm^{-3}$, conveniently in the range of about 5E20 to 7E21 $cm^{-3}$, and preferably in the range of about 1E21 to 5E21 $cm^{-3}$, but higher or lower doping may be used in other embodiments. Depth 561 is usefully in the range of about 0.01 to 0.15 micrometers, conveniently in the range of about 0.02 to 0.10 micrometers, and preferably in the range of about 0.05 to 0.07 micrometers, but larger or smaller depths may be used in other embodiments. Structure 312 results.

Referring now to manufacturing stage 213 of FIG. 13, mask 630 is removed and replaced with mask 650 having closed portion 651 and opening 652 over structure 312. Implant (F) (e.g., N+) is desirably provided through opening 652 to form (e.g., N+) contact region 64 of depth 641 in underlying (e.g., N-type) WELL region 53. Arsenic and phosphorous are examples of suitable dopants for forming contact region 64, but other dopants may be used in other embodiments. Contact region 64 usefully has doping in the range of about 1E20 to 1E22 $cm^{-3}$, conveniently in the range of about 5E20 to 7E21 $cm^{-3}$, and preferably in the range of about 1E21 to 5E21 $cm^{-3}$, but higher or lower doping may be used in other embodiments. Depth 641 is usefully in the range of about 0.01 to 0.15 micrometers, conveniently in the range of about 0.02 to 0.1 micrometers, and preferably in the range of about 0.05 to 0.07 micrometers, but larger or smaller depths may be used in other embodiments. Structure 313 results. Mask 650 is desirably removed. Other than providing whatever interconnections and/or electrical terminals (e.g., terminals 67, 68, 69 of FIG. 2A) and any desired surface passivation layers or dielectric interlayers, device 46 of FIG. 2A is substantially finished. Techniques for such "back-end" operations are well known in the art. In further embodiments where contact to WELL region 53 is made via either front-surface or back-surface connection to BL 50, which in these examples is ohmically coupled to WELL region 53, then manufacturing stage 213 may be omitted. Either arrangement is useful. Persons of skill in the art will understand how the various manufacturing stages illustrated in FIGS. 3-13 for obtaining device 46 illustrated in FIG. 2A may be modified in order to obtain device 146 illustrated in FIG. 2B, taking into account the differences in doping type illustrated in FIG. 2B. The doping concentrations, thicknesses, depths and distances described in connection with FIGS. 3-13 for device 46 of FIG. 2A also apply generally to the analogous regions of device 146 of FIG. 2B. However, in additional embodiments, different doping levels, thicknesses, depths or distances may also be used.

Figure 14:
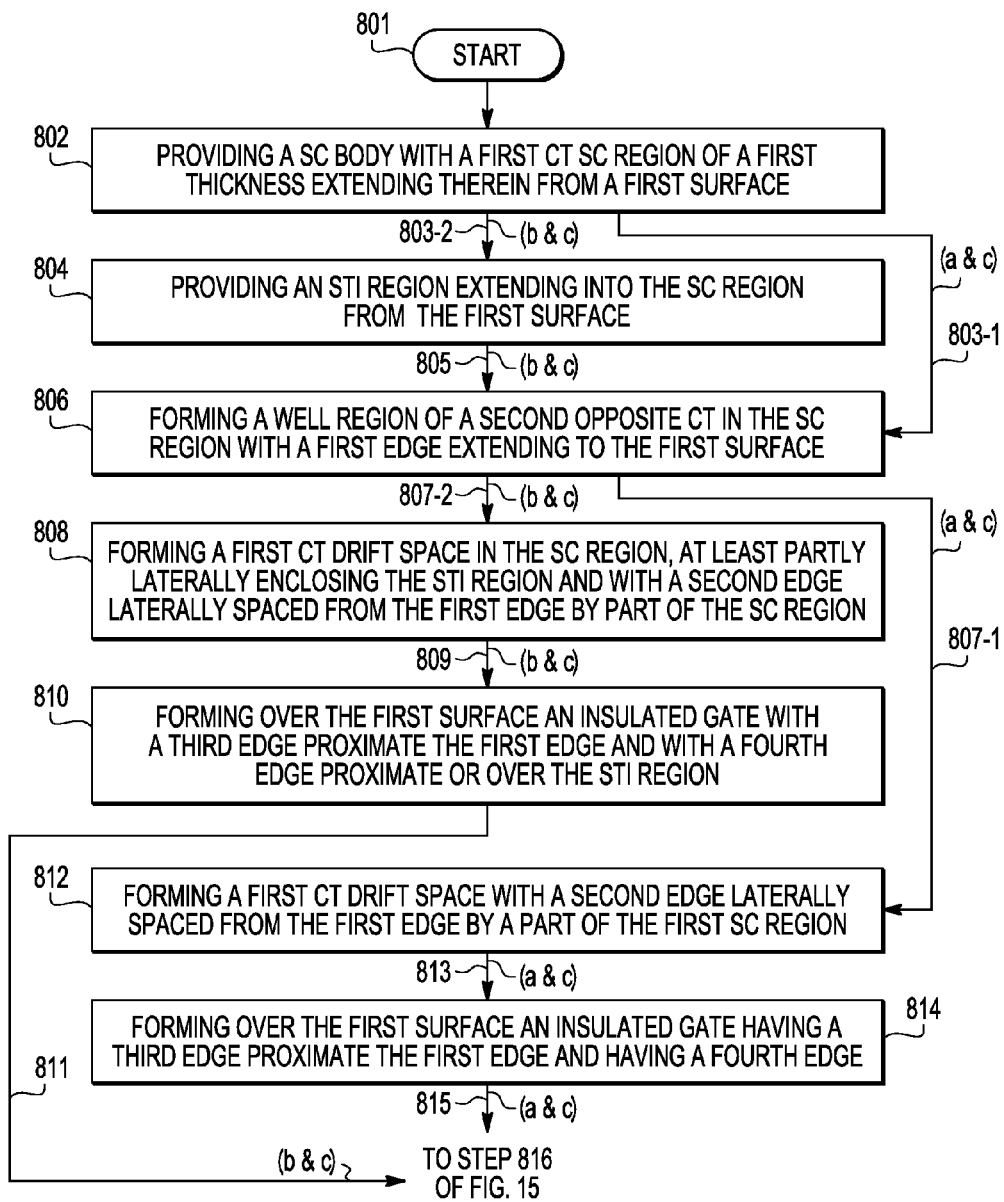
FIGS. 14 and 15 show simplified flow charts of methods of manufacture of the field LDMOS device of FIGS. 2A and 2B, according to still further embodiments of the invention.
Figure 15:
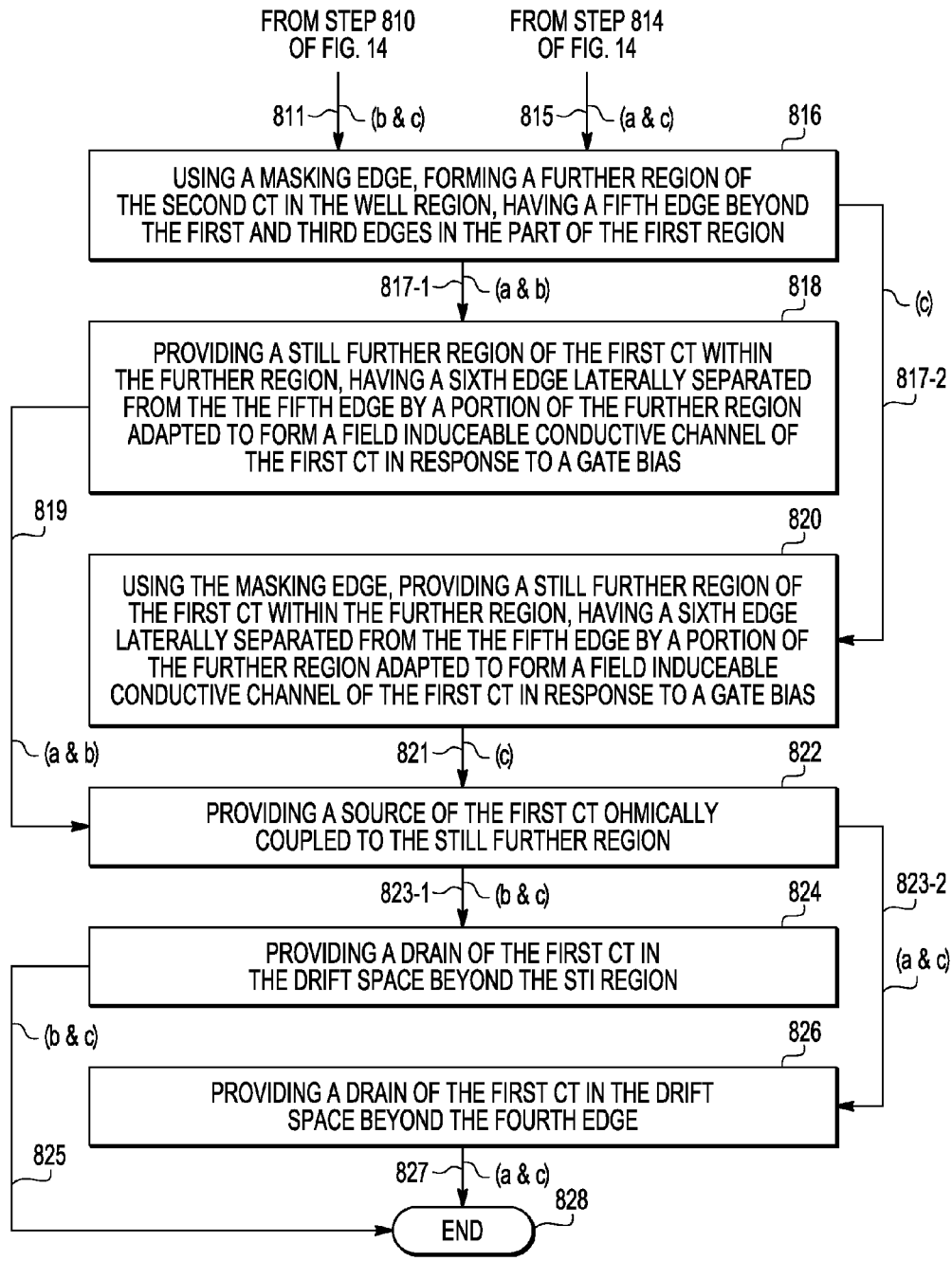

FIGS. 14 and 15 show a simplified flow chart of methods 800 of manufacture of field LDMOS device 46, 146 of FIGS. 2A and 2B, according to still yet further embodiments of the invention. Even reference numbers 802-828 are used to identify method steps and odd reference numbers 803-827 are used to identify paths between method steps. Method 800 illustrates three embodiments (a), (b) and (c). Embodiment (a) comprises START 801, step 802, path 803-1, step 806, path 807-1, steps 812, 814, 816, 818, path 819, step 822, path 823-2, step 826 and path 827 to end 828. Embodiment (b) comprises START 801, step 802, path 803-2, step 804, path 805, step 806, path 807-2, step 808, path 809, step 810, path 811, step 816, path 817-1, step 818, path 819, step 822, path 823-1, step 824 and path 825 to end 828. Embodiment (c) comprises either embodiments (a) or (b) through step 816 and then proceeds to step 820, path 821 to step 822, path 823-1 to step 824 or path 823-2 to step 826, and paths 825 or 827 to end 828. In FIG. 14, the abbreviation "CT" is used for the words "conductivity type" and the abbreviation "SC" is used for the word "semiconductor".

Referring now to FIGS. 14 and 15, embodiment (a) of method 800 begins with START 801 followed by initial step 802 wherein there is provided a semiconductor (SC) body (47) with a first conductivity type (CT) semiconductor (SC) region (51') of a first thickness (513) extending therein from a first surface (55) thereof. As indicated by path 803-1, in step 806 of embodiment (a) there is formed a WELL region (53) of a second, opposite, conductivity type (CT) in the semiconductor (SC) region (51') with a first (e.g., rightward) edge (531) extending to the first surface (55). As indicated by path 807-1, in step 812 of embodiment (a) there is formed a first conductivity type (CT) drift space (52) with a second (e.g. leftward) edge (521) laterally spaced from the first edge (531) by a part (511) of the first semiconductor (SC) region (51', 51). (As noted in the discussion of FIGS. 5 and 6, steps 806 and 812 may be performed in either order.) In step 814 of embodiment (a) there is formed over the first surface (55) an insulated gate (59) having a third (e.g., leftward) edge (591) proximate the first edge (531) (e.g., the rightward edge 531 of the WELL region (53)). In step 816 of embodiment (a) there is formed using a masking edge (591, 613) a further region (60', 60) of the second conductivity type (CT) in the WELL region (53) having a fifth edge beyond the first (531) and third (591) edges in the part (511) of the first semiconductor (SC) region (51). In step 818 of embodiment (a) there is provided a still further region (66', 66) of the first CT within the further region (60', 60), having a sixth edge (661) laterally separated from the fifth edge (601) by a portion of the further region (60) adapted to form a field induceable conductive channel (72) of the first CT in response to a gate bias. Embodiment (a) then proceeds along path 819 to step 822 wherein there is provided a source (57) of the first CT Ohmically coupled to the still further region (66). As indicated by path 823-2, embodiment (a) proceeds to step 826 wherein there is provided a drain (56) of the first CT in the drift space (52) beyond the fourth edge (592). (Steps 822 and 826 may be performed in either order.) Embodiment (a) then proceeds via path 827 to END 828.

Referring again to FIGS. 14 and 15, embodiment (b) of method 800 begins with START 801 followed by initial step 802 wherein there is provided a semiconductor (SC) body (47) with a first conductivity type (CT) semiconductor (SC) region (51') of a first thickness (513) extending therein from a first surface (55) thereof. As indicated by path 803-2, in step 804 of embodiment (b) an STI (62) region is provided extending into the SC region (51') from the first surface (55). As indicated by path 805, embodiment (b) proceeds to step 806 wherein there is formed a WELL region (53) of a second, opposite, conductivity type (CT) in the semiconductor (SC) region (51') with a first (e.g., rightward) edge (531) extending to the first surface (55). As indicated by path 807-2, in step 808 of embodiment (b) there is formed a first CT drift space (52) in the SC region (51'), at least partly laterally enclosing the STI region (62) and with a second (e.g., leftward) edge (521) laterally spaced from the first edge (531) by part (511) of the SC region (51', 51). (As noted in the discussion of FIGS. 5 and 6, steps 806 and 808 may be performed in either order.) In step 810 of embodiment (b) there is formed over the first surface (55) an insulated gate (59) having a third (e.g., leftward) edge (591) proximate the first edge (531) and a fourth edge (592) proximate or over the STI region (62). As indicated by path 811, in step 816 of embodiment (b) there is formed using a masking edge (591, 613) a further region (60', 60) of the second conductivity type (CT) in the WELL region (53) having a fifth edge beyond the first (531) and third (591)

edges in the part (511) of the first semiconductor (SC) region (51). As shown by path 817-2, in step 818 of embodiment (b) there is provided a still further region (66', 66) of the first CT within the further region (60', 60), having a sixth edge (661) laterally separated from the fifth edge (601) by a portion of the further region (60) adapted to form a field induceable conductive channel (72) of the first CT in response to a gate bias. Embodiment (b) then proceeds along path 819 to step 822 wherein there is provided a source (57) of the first CT Ohmically coupled to the still further region (66). As indicated by path 823-1, embodiment (b) proceeds to step 824 wherein there is provided a drain (56) of the first CT in the drift space (52) beyond the STI region (62). (Steps 822 and 824 may be performed in either order.) Embodiment (b) then proceeds via path 825 to END 828.

Referring still again to FIGS. 14 and 15, embodiment (c) proceeds via the same paths and steps as either embodiment (a) or embodiment (b) through step 816. As shown by path 817-2, embodiment (c) proceeds to step 820 wherein, for example, using the masking edge (591, 613), there is provided a still further region (66', 66) of the first CT within the further region (60', 60), having a sixth edge (661) laterally separated from the fifth edge (601) by a portion of the further region (60', 60) adapted to form a field induceable conductive channel (72) of the first CT in response to a gate bias. As indicated by path 821, embodiment (c) then proceeds to end 828 through the same alternative steps as embodiments (a) or (b).

Persons of skill in the art will understand that the steps illustrated in embodiments (a), (b) and (c) above may be performed in various orders other than those specifically listed or noted above, and the various paths mentioned above are intended to be exemplary and not limiting. Further, as has been explained in connection with FIGS. 10 and 11, sidewall spacers 63 may be provided on edges 591, 592 of gate 59 after gate 59 has been formed in steps 810 or 814, and all such variations including different orders are intended to be included in method 800.

According to a first embodiment, there is provided a field LDMOS device (46, 146), comprising, a semiconductor body (47, 147) having a first surface (55, 155), and having therein a drift space (52, 152) of a first conductivity type with a first edge (521, 1521) extending to the first surface (55, 155) and a WELL region (53, 153) of a second, opposite, conductivity type with a second edge (531, 1531) extending to the first surface (55, 155), the first (521, 1521) and second (531, 1531) edges being laterally separated by a first conductivity type part (511, 1511) of the semiconductor body (47, 147), a source (57, 157) and drain (56, 156) of the first conductivity type in the semiconductor body (47, 147), the source (57, 157) being located in the WELL region (53, 153) and the drain (56, 156) being located in the drift space (52, 152), an insulated gate (59, 159) located over the semiconductor body (47, 147), the gate having a third edge (591, 1591) toward the source (57, 157) and a fourth edge (592, 1592) toward the drain (56, 156), a doped further region (60, 160) of the second conductivity type extending across a part of the WELL region (53, 153) and under the third edge (591, 1591) and having a fifth edge (601, 1601) in the part (511, 1511) of the semiconductor body (47, 147), and a doped still further region (66, 166) of the first conductivity type in the further region (60, 160), in Ohmic contact with the source (57, 157), having a sixth edge (661, 1661) laterally proximate the third edge (591, 1591) and separated from the fifth edge (601, 1601) by a part of the further region (60, 160) adapted to form therein a field induceable conductive channel (72, 172) of the first conductivity type. According to a further embodiment, the field induceable channel (72, 172) has a channel length (61, 161) laterally bounded by the fifth (601, 1601) and the sixth (661, 1661) edges. According to a still further embodiment, the channel length (61, 161) is in the range of about 0.005 to 0.20 micrometers. According to a yet further embodiment, the further region (60, 160) is formed by an angled implant. According to a still yet further embodiment, the further region (60, 160) is formed by an angled implant using the gate (59, 159) at least in part as a mask therefore. According to a yet still further embodiment, the angled implant is performed at an angle α with respect to a normal (71, 171) to the first surface (55, 155) in a range of about $10 \leq \alpha \leq 70$ degrees. According to another embodiment, the further region (60, 160) and the still further region (66, 166) are formed using a common masking edge (591, 1591, 613). According to a still another embodiment, the further region (60, 160) has a further region doping concentration $C_{FR}$, and the still further region (66, 166) has a still further region doping concentration $C_{SFR}$ and $C_{SFR} > C_{FR}$. According to a yet another embodiment, the further region (60, 160) has a further region doping concentration $C_{FR}$, and the part (511, 1551) of the semiconductor body (47, 147) has a doping concentration $C_{PSCB}$, and the ratio $C_{FR}/C_{PSCB}$ is in the range from about $10^1$ to about $10^8$.

According to a second embodiment, there is provided a method for forming a field LDMOS device (46, 146), comprising, providing a semiconductor (SC) body (47, 147) with a first conductivity type (CT) semiconductor (SC) region (51', 51, 151) of a first thickness (513) extending therein from a first surface (55, 155) thereof, forming a WELL region (53, 153) of a second, opposite, opposite conductivity type (CT) in the semiconductor (SC) region (51', 51, 151), forming a first conductivity type (CT) drift space (52, 152) laterally spaced from the WELL region (53, 153) by part (511) of the first semiconductor (SC) region (51', 51, 151), forming over the first surface (55, 155) an insulated gate (59, 159) with a first gate edge (591, 1591) and a second gate edge (592, 1592), forming a further region (60', 60, 160) of the second conductivity type (CT) so that it lies partly in the WELL region (53, 153) and extends under the first gate edge (591, 1591) and has a further region edge (601, 1601) in the part (511, 1511) of the first semiconductor (SC) region (51', 51, 151), forming a still further region (66', 66, 166) of the first conductivity type (CT) in the further region (60', 60, 160) and having a still further region edge (661, 1661) separated from the further region edge (601, 1601) by a length (61, 161) within the further region (60', 60, 160) corresponding to a field induceable channel (72, 172) of the first CT adapted to be formed by the gate (59, 159) within the further region (60', 60, 160), and providing a source (57, 157) of the first conductivity type (CT) in Ohmic contact with the still further region (66, 166), and a drain (56, 156) of the first conductivity type (CT) in the drift space (52, 152) beyond the second gate edge (592, 1592). According to a further embodiment, further region (60', 60, 160) has a doping concentration $C_{FR}$ and the still further region (66', 66, 166) has a dopant concentration $C_{SFR}$, and the ratio $C_{SFR}/C_{FR}$ lies in the range from about 2 to about $10^2$. According to a still further embodiment, the further region (60', 60, 160) has a doping concentration $C_{FR}$, and the part (511, 1511) of the semiconductor region (51, 151) has a doping concentration $C_{PSCB}$, and the ratio $C_{FR}/C_{PSCR}$ is in the range from about $10^1$ to about $10^8$. According to a yet further embodiment, the step of forming the further region (60', 60, 160) is performed using an implant at an angle α>0 with respect to a normal (71, 171) to the first surface (55, 155). According to a still yet further embodiment, $10 < \alpha < 70$. According to a yet still further embodiment, the method further comprises forming a shallow trench isolation (STI)

region (62, 162) in the drift space (52, 152) at least partly underlying the gate (59, 159) and extending substantially to the drain (56, 156).

According to a third embodiment, there is provided a semiconductor device (46, 146), comprising, a semiconductor (SC) body (47, 147) having a first surface (55, 155) and comprising a SC region (51, 151) of a first conductivity type extending to the first surface (55, 155), a WELL region (53, 153) of a second, opposite, conductivity type extending into the SC region (51, 151) beneath the first surface (55, 155) and having a first boundary (531, 1513) extending to the first surface (55, 155), a drift space (52, 152) of the first conductivity type extending into the SC region (51, 151) beneath the first surface (55, 155) and having a second boundary (521, 1521) extending to the first surface (55, 155), the second boundary (521, 1521) being spaced apart from the first boundary (531, 1531) by a part (511, 1551) of the SC region (51, 151), a gate (59, 159) formed over and separated from the first surface (55, 155) by a gate insulator (58, 158), the gate having a first edge (591, 1591) laterally substantially proximate the first boundary (531, 1531) and a second edge (592, 1592) spaced apart from the first boundary (531, 1531), a source (57, 157) of the first conductivity type in the WELL region (53, 153) spaced apart from the first edge (591, 1591), a drain (56, 156) of the first conductivity type in the drift space (52, 152), a further region (60, 160) of the second conductivity type in the WELL region (53, 153) and having a third boundary (601, 1601) beyond the first edge (591, 1591) a predetermined lateral distance (61', 61, 161) greater than zero from the first boundary (531, 1531) into the part (511, 1511) of the SC region (51, 151), and a still further region (66, 166) of the first conductivity type in the further region (60, 160) in Ohmic contact with the source (57, 157) and having a fourth boundary (661, 1661) separated from the third boundary (601, 1601) by a length (61, 161) in the further region (60, 160) adapted when subject to an electric field to form a channel (72, 172) of the first conductivity type extending from the fourth boundary (661, 1661) to the part (511, 1551) of the SC region (51, 151). According to a further embodiment, the still further region (66) has a doping concentration $C_{SFR}$ in the range of about 1E19 to 1E20 cm$^{-3}$. According to a still further embodiment, the part (511, 1551) of the SC region (51, 151) has a doping concentration $C_{PSCR}$ in the range of about 1E13 to 1E16 cm$^{-3}$. According to a yet further embodiment, the further region (60, 160) has a doping concentration $C_{FR}$ in the range of about 1E18 to 5E20 cm$^{-3}$. According to a still yet further embodiment, the still further region (66) has a doping concentration $C_{SFR}$ and wherein the further region (60, 160) has a doping concentration $C_{FR}$ and a ratio $C_{SFR}/C_{FR}$ lies between about 2 to $10^2$.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A field LDMOS device, comprising:
 a semiconductor body having a first surface, and having therein a drift space of a first conductivity type with a first edge extending to the first surface and a WELL region of a second, opposite, conductivity type with a second edge extending to the first surface, the first and second edges being laterally separated by a first conductivity type part of the semiconductor body;
 a source and drain of the first conductivity type in the semiconductor body, the source being located in the WELL region and the drain being located in the drift space;
 an insulated gate located over the semiconductor body, the gate having a third edge toward the source and a fourth edge toward the drain;
 a doped further region of the second conductivity type extending across a part of the WELL region and under the third edge and having a fifth edge in the part of the semiconductor body; and
 a doped still further region of the first conductivity type in the further region, in Ohmic contact with the source, having a sixth edge laterally proximate the third edge and separated from the fifth edge by a part of the further region adapted to form therein a field induceable conductive channel of the first conductivity type, the field induceable channel having a channel length laterally bounded by the fifth and the sixth edges.

2. The LDMOS device of claim 1, wherein the channel length is in the range of about 0.005 to 0.20 micrometers.

3. The LDMOS device of claim 1, wherein the further region is formed by an angled implant.

4. The LDMOS device of claim 1, wherein the further region is formed by an angled implant using the gate at least in part as a mask therefore.

5. The LDMOS device of claim 3, wherein the angled implant is performed at an angle α with respect to a normal to the first surface in a range of about $10 \leq \alpha \leq 70$ degrees.

6. The LDMOS device of claim 1, wherein the further region and the still further region are formed using a common masking edge.

7. The LDMOS device of claim 1, wherein the further region has a further region doping concentration $C_{FR}$, and the still further region has a still further region doping concentration $C_{SFR}$ and $C_{SFR} > C_{FR}$.

8. The LDMOS device of claim 1, wherein the further region has a further region doping concentration $C_{FR}$, and the part of the semiconductor body has a doping concentration $C_{PSCB}$, and the ratio $C_{FR}/C_{PSCB}$ is in the range from about $10^1$ to about $10^8$.

9. A semiconductor device, comprising:
 a semiconductor (SC) body having a first surface and comprising a SC region of a first conductivity type extending to the first surface;
 a WELL region of a second, opposite, conductivity type extending into the SC region beneath the first surface and having a first boundary extending to the first surface;
 a drift space of the first conductivity type extending into the SC region beneath the first surface and having a second boundary extending to the first surface, the second boundary being spaced apart from the first boundary by a part of the SC region;
 a gate formed over and separated from the first surface by a gate insulator, the gate having a first edge laterally substantially proximate the first boundary and a second edge spaced apart from the first boundary;

a source of the first conductivity type in the WELL region spaced apart from the first edge;

a drain of the first conductivity type in the drift space;

a further region of the second conductivity type in the WELL region and having a third boundary beyond the first edge a predetermined lateral distance greater than zero from the first boundary into the part of the SC region; and a still further region of the first conductivity type in the further region in Ohmic contact with the source and having a fourth boundary separated from the third boundary by a length in the further region adapted when subject to an electric field to form a channel of the first conductivity type within the part of the SC region and laterally bound by the fourth boundary of the still further region and the third boundary of the further region.

10. The semiconductor device of claim 9, wherein the still further region has a doping concentration $C_{SFR}$ in the range of about 1E19 to 1E20 cm$^{-3}$.

11. The semiconductor device of claim 10, wherein the part of the SC region has a doping concentration $C_{PSCR}$ in the range of about 1E13 to 1E16 cm$^{-3}$.

12. The semiconductor device of claim 11, wherein the further region has a doping concentration $C_{FR}$ in the range of about 1E18 to 5E20 cm$^{-3}$.

13. The semiconductor device of claim 9, wherein the still further region has a doping concentration $C_{SFR}$ and wherein the further region has a doping concentration $C_{FR}$ and a ratio $C_{SFR}/C_{FR}$ lies between about 2 to $10^2$.

14. The semiconductor device of claim 9, wherein the fourth boundary of the still further region is substantially laterally aligned with the first edge of the gate.

15. The semiconductor device of claim 14, wherein the first boundary of the WELL region is substantially laterally aligned with the fourth boundary of the still further region and the first edge of the gate.

16. The semiconductor device of claim 9, wherein the length of the channel is between about 0.005 and about 0.20 micrometers.

17. The semiconductor device of claim 16, wherein the length of the channel is between about 0.05 and about 0.075 micrometers.

18. The semiconductor device of claim 9, further comprising a shallow trench isolation (STI) region in the drift space at least partly underlying the gate and extending substantially to the drain.

19. The semiconductor device of claim 9, wherein the doping concentration of the part of the SC region, as taken at the terminus of the channel, is less than the doping concentration of the drift space.

* * * * *